United States Patent [19]

Valenti et al.

[11] Patent Number: 4,857,857
[45] Date of Patent: Aug. 15, 1989

[54] ELECTRODE CATHETER TESTING DEVICE

[75] Inventors: Andrew Valenti, Uniondale; Antonio Perez, Flushing, both of; Seymour Ben-Zvi, Brooklyn, all of N.Y.

[73] Assignee: The Research Foundation of State University of New York, New York, N.Y.

[21] Appl. No.: 275,277

[22] Filed: Nov. 23, 1988

[51] Int. Cl.[4] .......................................... G01R 31/12
[52] U.S. Cl. .................................. 324/555; 324/65 R
[58] Field of Search ................. 324/555, 65 R, 537, 324/65 P

[56] References Cited

U.S. PATENT DOCUMENTS

| | | | |
|---|---|---|---|
| 1,308,390 | 7/1919 | Beaver et al. | 324/539 |
| 3,170,753 | 7/1962 | Witte et al. | 439/788 |
| 3,281,751 | 10/1966 | Blair . | |
| 4,220,921 | 9/1980 | Hach | 324/65 P |
| 4,643,513 | 2/1987 | Martin . | |

4,788,622 11/1988 Cinquin .......................... 324/555

Primary Examiner—Reinhard J. Eisenzopf
Assistant Examiner—Maura K. Regan
Attorney, Agent, or Firm—Morgan & Finnegan

[57] ABSTRACT

An electrode catheter testing device is shown which provides a practical means for determining, immediately prior to use, whether an electrode catheter is functioning properly. The device includes a pair of telescoping tube members axially displaced by means of a spring and enclosing a braided wire cylinder which defines a core for receiving the electrode end of an electrode catheter. When the spring is manually compressed, the braided wire cylinder's diameter is increased to permit insertion of the catheter. When the spring is released, the braided wire cylinder is elongated and its diameter is contracted such that the cylinder contacts the electrode rings shorting them together. Continuity to each electrode ring may then be measured electrically using a suitable instrument such as a ohmmeter.

3 Claims, 3 Drawing Sheets

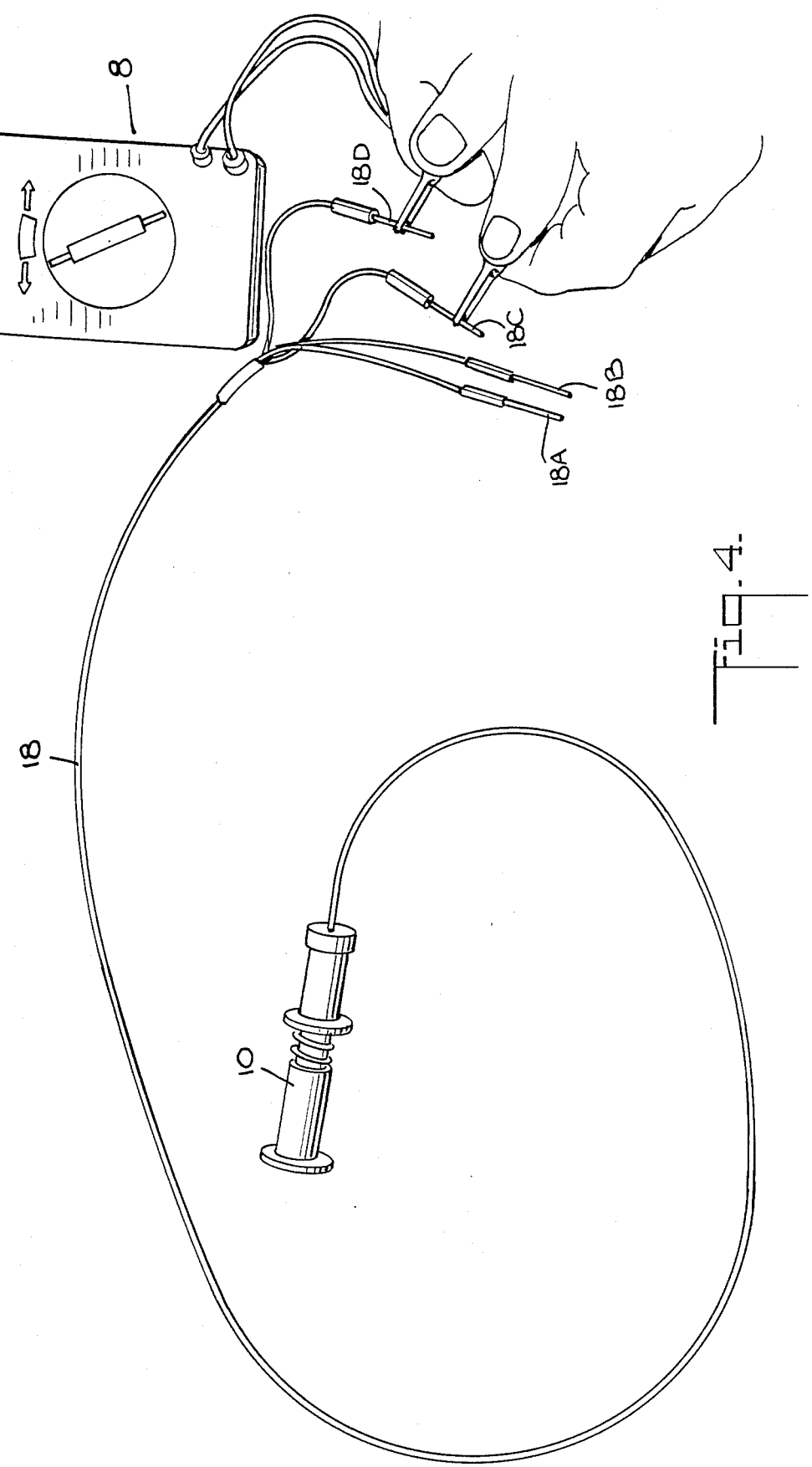

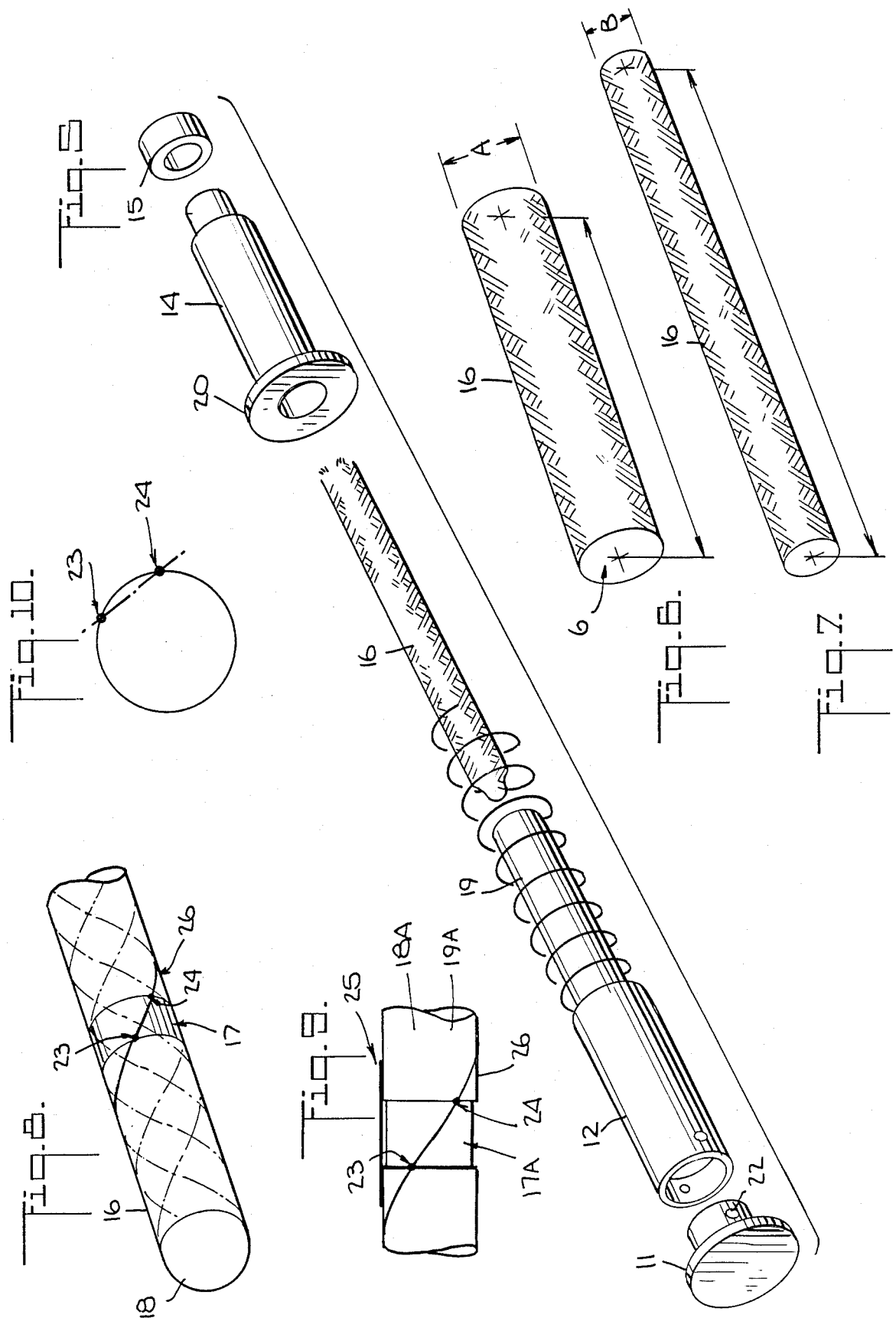

ELECTRODE CATHETER TESTING DEVICE

BACKGROUND OF THE INVENTION

1. Field of the Invention

This invention relates generally to electrical circuit continuity testers and in particular to a novel continuity tester for use with electrode catheters.

2. Description of the Prior Art

An electrode catheter is a medical instrument designed to be inserted into a blood vessel or other body part, which is used for electrical stimulation or for the recording of electrophysiological information. A typical electrode catheter consists of a central core of wires which terminate at one end with one or more electrode rings. The end of the electrode catheter having the electrode rings is designed to be inserted into the blood vessel or other body part. The central core of wires which make up the electrode catheter terminate at the other end with a pin plug or other electrical connector which can be attached to an electronic instrument for pacing or for recording electrophysiological information.

The electrode catheter is a small and expensive device which is very fragile. As a result of its fragile nature, the catheter can be damaged prior to use or between uses. Because of the trauma associated with the catheter's insertion into a blood vessel, one should only use the device when reasonably assured that it is in working condition. For this reason, the manufacturers of electrode catheters recommend that a new catheter be used only once and then discarded because, at present, there is no convenient way to assure that the catheter is in working condition before use.

In addition, electrode catheters are expensive. It is therefore apparent that the ability to make multiple use of the catheters would result in substantial cost savings. Thus, there is a need for a device which provides a means to perform a convenient electrical continuity test for electrode catheters so that their functionality can be assured prior to use. This would allow the catheter to be re-used on multiple occasions.

Circuit continuity testers are generally known in the prior art. Such testers are used to establish whether or not circuit continuity exists between probe points in a circuit or terminals of a conductor or cable. Such testers normally employ a source of potential in series with the test probes and an instrument such as a lamp or a meter for determining proper electrical conductivity between the probe points.

Illustrative is U.S. Pat. No. 4,005,362 issued to Fortino which describes a typical electrical circuit continuity tester of simple construction. The continuity tester employs a light bulb, a cylindrical tube, batteries and 2 contacts which serve as probes for determining the continuity of a circuit. While such a device and others like it are extremely simple in nature, they do not provide a suitable means to make a quick and practical electrical connection with the electrode rings of the electrode catheter.

For cable testing, it is known to combine a continuity tester with appropriate connectors designed to mate with the terminating connectors of the cables to be tested. However, such arrangements are not practically suitable for making electrical contact with catheter electrodes because good contact must be made to the electrode rings without incurring any damage to the electrode rings or adjacent insulating materials. They also fail to meet the special requirements often attending medical environments.

OBJECTS OF THE PRESENT INVENTION

The principal object of the present invention is to provide a practical, nondamaging and convenient continuity tester for an electrode catheter to assure that it is functional immediately prior to use with a patient.

A further object of the present invention is to provide a practical and convenient continuity tester for an electrode catheter to allow the catheter to be re-used after its initial use for as long as it is operational.

A further object of the present invention is to provide a universal electrode catheter testing device for accommodating a plurality of different electrode catheter designs A further object of the present invention is to provide an electrode catheter testing device which is mechanically simple and easy to operate, yet of durable construction so that it will remain operational through numerous cycles of sterilization.

A further object of the present invention is to provide an electrical testing device of the class described with the capability of being sterilized so that it can be used in a sterile field by an operator using sterile techniques.

SUMMARY OF THE INVENTION

The present invention provides a device which permits a practical electrical continuity test to determine whether an electrode catheter is functioning properly. The object of the device is to provide a means for testing the electrode catheter so that its functionality can be determined immediately prior to use thereby making multiple uses of the catheter possible.

The device of the present invention utilizes a braided wire cylinder to make an electrical connection across the electrode rings of the electrode catheter thereby shorting them together. The electrical leads at the other end of the catheter are then connected to a suitable test instrument such as an ohmmeter or continuity tester to test for proper electrical conductivity between the leads and their respective electrodes.

The braided wire cylinder has certain characteristics which make it uniquely suited for this task. When a wire braid is pulled upon, its length will increase and the diameter of its inner core will decrease. If a braided wire cylinder is compressed, its length is decreased and the diameter of its inner core will increase. Thus, when the electrode end of the catheter is placed inside the core of the braided wire cylinder when it is in a compressed position and the braided wire is then stretched, the braided wire will make contact with the electrode rings of the catheter placed inside its core thereby shorting them together.

This braided wire cylinder may be mounted within a pair of telescoping tube members axially displaced by means of a spring. The braided wire cylinder defines a core for receiving the electrode end of the catheter. When the spring is depressed, the braided wire cylinder is compressed and its diameter is increased. The electrode catheter is then inserted within the inside core of the braided wire cylinder and the spring is released When the spring is released, the braided wire cylinder is stretched and its diameter decreases. In this manner, the braided wire cylinder comes into contact with the electrode rings of the catheter thereby creating a common electrical contact across the electrode rings. The electrical leads of the catheter are then connected to a suitable test instrument, such as an ohmmeter, to test for proper electrical conductivity between the leads and their respective electrodes which have been shorted together by the contact of the braided wire.

BRIEF DESCRIPTION OF THE DRAWINGS

This invention will be better understood from the following description taken in conjunction with the accompanying drawings, and its scope will b pointed out in the appended claims.

FIG. 4 is an elevational perspective view of an embodiment of the electrode catheter testing device shown with an electrode catheter inserted in its core and the catheter connected to a meter for measuring the conductivity between pin connectors.

FIG. 5 is an exploded perspective view of an embodiment of the electrode catheter testing device of the present invention showing all of the parts separated but arranged in the vertical order in which they would be assembled together.

FIGS. 6 and 7 illustrate a spring's effect on a braided wire cylinder. FIG. 6 shows the braided wire cylinder in a compressed position so that it is at its shortest length and largest diameter. FIG. 7 shows the braided wire cylinder at a stretched position where it assumes its longest length and smallest diameter.

FIG. 8 is a fragmentary elevational view of a braided wire cylinder with an electrode catheter inserted in its core, showing the strands of the wire braid coming into contact with the electrode ring in a spiral position.

FIG. 9 is an elevational view similar to that of FIG. 8 showing an enlarged view of a single wire strand of the wire braid coming into contact with the electrode ring of the electrode catheter.

FIG. 10 is an end projection of a single wire strand drawn taut spirally across an electrode ring showing how the wire strand assumes a path that would cross beneath the catheter circumference.

DESCRIPTION OF THE PREFERRED EMBODIMENTS

Figure 1:
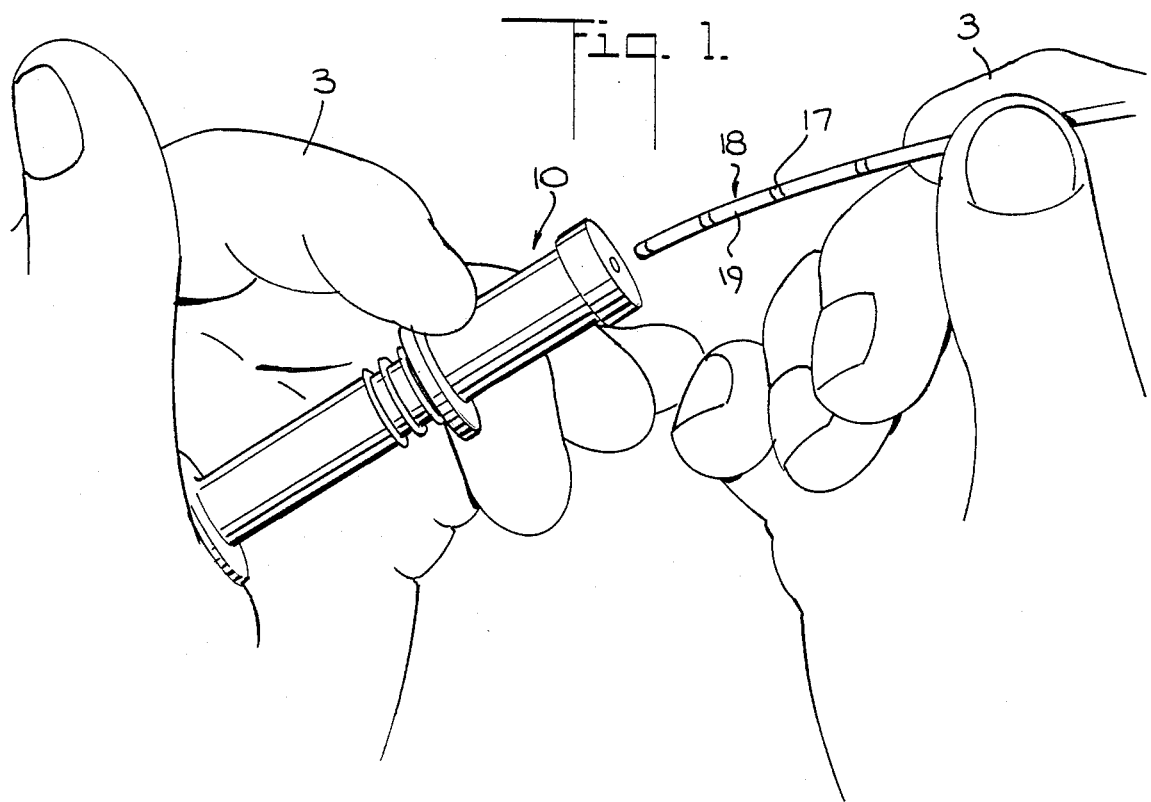
FIG. 1 is a side elevational, respective view of an embodiment of the electrode catheter testing device of the present invention showing how the electrode catheter, while being held in a person's hand, is inserted into the embodiment to test the functioning of the catheter.

FIG. 1 shows a preferred embodiment of the electrode catheter testing device 10 of the present invention and a catheter 18 having electrode rings 17 and a plastic coating 19 being held in a person's hands 3.

As illustrated in the drawings, and, with particular reference to FIGS. 1 and 4, the instrument embodying the present invention includes catheter test unit 10 adapted to receive the electrode end of catheter 18 for the purpose of checking the continuity of the electrode rings 17.

The electrical leads 18A, 18B, 18C and 18D at the other end of the catheter (FIG. 4), are connected to a suitable test instrument such as an ohmmeter or a continuity tester 8 to test for proper electrical conductivity between the leads and their respective electrodes 17 (FIG. 1) which, in the test position of the tester 10, have been shorted together.

Figure 2:
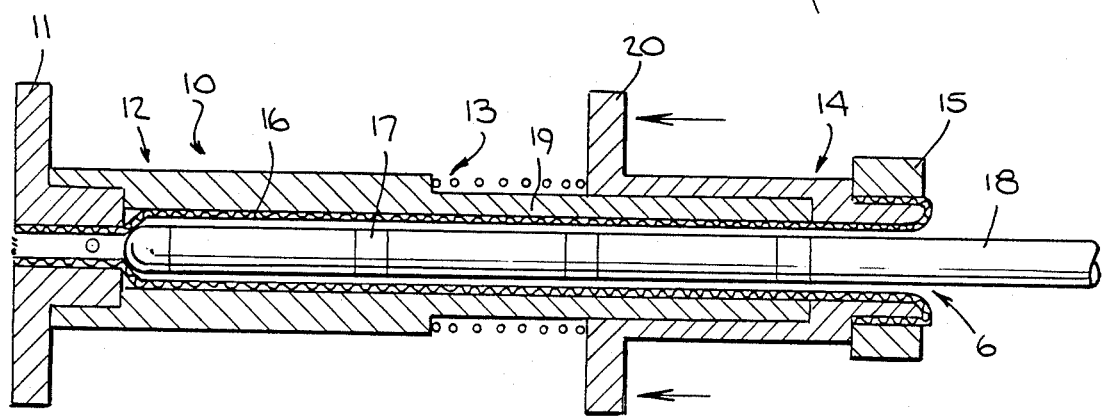
FIG. 2 is a cross sectional elevational view of an embodiment of the testing device with its spring depressed and its hollow braided wire at its widest diameter so that the electrode catheter can be inserted in its core.
Figure 3:
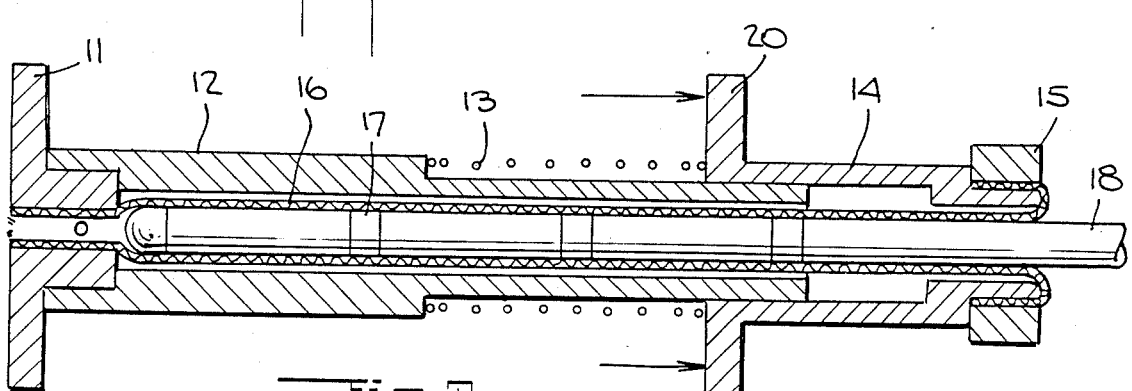
FIG. 3 is a cross sectional elevational view of an embodiment of the testing device as in FIG. 2, but with the spring released and the braided wire cylinder stretched so that it makes contact with the electrode catheter to be tested.

As particularly shown in FIGS. 2 and 3, the test unit 10 includes a pair of telescoping tube members 12 and 14 axially displaced by means of spring 13 and enclosing a braided wire cylinder 16 which defines a core 6 for receiving the electrode end of the catheter 18 such that the electrode rings 17 are located inside the braided wire cylinder 16.

The terminal end of the braided wire cylinder 16 is secured to a lower retaining cap 11. Lower retaining cap 11 is constructed so that its flat bottom surface forms a disc which is used as a base when the tester is compressed. The lower retaining cap 11 is connected in turn to telescoping member 12 while the receiving end of the cylinder 16 connects to the receiving end of telescoping member 14. This latter connection is accomplished with the aid of a ring clamp 15 which clamps over the folded-over end of cylinder 16 to member 14.

Spring 13, which is mounted coaxially on a reduced section 19 of tube member 12, has one end abutting the rim formed by the reduction of member 12 and the other end bearing against a flange 20 on the telescoping section 14. In the position shown in FIG. 2, spring 13 has been manually compressed by squeezing or compressing flange 20 relative to the lower retaining cap 11 attached to tube section 12. As a result of the attendant shortening of the braided wire cylinder 16, the cylinder's diameter is increased to permit insertion of the electrode catheter 18.

Thereafter, when the pressure on flange 20 is relieved, the telescoping members 12 and 14 separate causing a concomitant elongation of the braided wire cylinder 16 and a reduction in its diameter such that the cylinder 16 contacts all of the electrode catheter rings 17 shorting them together. Continuity to each catheter ring 17 may then be measured electrically using a suitable instrument such as the ohmmeter 8.

Attention is now directed to FIGS. 6 and 7 which illustrate the effect of the spring 13 (of FIG. 2) on the braided wire cylinder 16. When the braided wire cylinder 16 is depressed by applying downward pressure on the spring 13, the braided wire cylinder 16 assumes a position with the largest diameter A of its inner core 6 as shown in FIG. 6. When the spring is released, the braided wire cylinder 16 is stretched and it assumes a position where its inner core 6 has the smallest diameter B as shown in FIG. 7. In this position, the braided wire cylinder 16 is allowed to make contact with the electrode rings 17 of the electrode catheter 18 inserted in its core 6, thereby making a common electrical contact across the electrode rings 17 of the catheter 18.

Turning to a consideration of FIGS. 8, 9 and 10, the ability to use the electrode catheter testing device 10 of the current invention with a variety of electrode catheter designs is illustrated.

FIG. 8 illustrates a single wire strand 26 of the hollow braided wire 16 as it crosses an electrode ring 17 of the electrode catheter 18. The plastic to metal cross over points of the electrode ring 17 are labeled 23 and 24 for reference purposes. Notice that the single wire strand 26 is drawn taut spirally as it crosses the electrode ring 17.

FIG. 10 illustrates points 23 and 24 from an end projection. A wire going from points 23 to 24, if not supported by the metal electrode ring, would assume a path shown by the straight line between them. That path passes below the catheter circumference.

Occasionally, an electrode catheter 18A will have a construction such that its electrode rings 17A will be slightly recessed below the surface of its plastic coating 19A as shown in FIG. 9. A wire 25 drawn taut axially across the electrode ring 17A will not make contact with the recessed electrode ring 17A. However, a wire 26 which is drawing taught spirally as in the case of a single strand of a braided wire cylinder, will contact the surface of the recessed electrode ring 17A if the electrode ring 17A is not too recessed. Thus, the electrode catheter testing device 10 of the current invention has the capability of being used with a variety of electrode catheter designs, including those with recessed electrode rings 17A.

Electrode catheters come in varying diameters with varying numbers of electrode rings having varying configurations. Because of the flexibility of the braided wire cylinder, the catheter testing device of the present invention can be used with a variety of electrode catheter designs The electrode catheter testing device of the present invention will generally be constructed of stainless steel or other similar material which has the ability to undergo repeated sterilizations by autoclaving The device can thus be used just prior to use of the electrode catheter in a sterile field by an operator using sterile techniques. This will provide maximum assurance that the electrode catheter is suitable for use.

The testing device is suitable for use in the sterile field just prior to insertion of the catheter because of its ease of operation. Once the catheter is inserted in the tester and the spring is released, the braided wire clutches the catheter, leaving the operator's hands free to perform other tasks.

Modifications of the invention will occur to those skilled in the art. Therefore, it is to be understood that this invention is not limited to the particular embodiments disclosed but that it is intended to cover all modifications which are within the true spirit and scope of the invention as claimed.

What is claimed is:

1. A testing apparatus for testing an electrode catheter having a plurality of electrodes at one end thereof comprising an electrically conductive member configured to expand and contract radially; means for radially expanding said member to receive said electrodes and for thereafter causing said member to contract radially to electrically short said electrodes whereby the electrical continuity of the electrode circuits may be checked.

2. A device for testing electrode catheters having a plurality of electrode rings at one end thereof; said device comprising:
    (a) telescoping upper and lower tubular members enclosing a central braided wire cylinder having a core for receiving said electrode end of said catheter; said braided wire cylinder having a lower end that is functionally attached to said lower tubular member and an upper end functionally attached to said upper tubular member; said lower tubular member having a recessed upper portion slidably mounted within the upper tubular member; (b) a spring mounted coaxially on said recessed portion of the lower tubular member separating the upper and lower tubular members whereby depressing the upper tubular member compresses the spring and causes the braided wire cylinder to expand for insertion of said catheter and for thereafter causing said braided wire cylinder to contract radially upon release of the spring and contact the electrode rings to electrically short said electrodes for testing the continuity of the electrical circuit of the electrode catheter.

3. The device of claim 2, wherein said braided wire cylinder is composed of stainless steel.

* * * * *